US008525322B1

(12) United States Patent  
Kim et al.

(10) Patent No.: US 8,525,322 B1  
(45) Date of Patent: Sep. 3, 2013

(54) SEMICONDUCTOR PACKAGE HAVING A PLURALITY OF INPUT/OUTPUT MEMBERS

(76) Inventors: Yong Woo Kim, Kwangju (KR); Yong Suk Yoo, Seoul (KR)

(*) Notice: Subject to any disclaimer, the term of this patent is extended or adjusted under 35 U.S.C. 154(b) by 37 days.

(21) Appl. No.: 13/286,005

(22) Filed: Oct. 31, 2011

Related U.S. Application Data

(62) Division of application No. 10/972,686, filed on Oct. 25, 2004, now Pat. No. 8,072,058.

(51) Int. Cl.  
*H01L 23/538* (2006.01)

(52) U.S. Cl.  
USPC ........... 257/691; 257/685; 257/700; 257/686; 257/698; 257/678; 257/693; 257/690; 257/E23.169

(58) Field of Classification Search  
USPC ............... 257/685, 700, 686, 698, 678, 693, 257/691, 690, E23.169; 438/108, 109  
See application file for complete search history.

(56) References Cited

U.S. PATENT DOCUMENTS

| 5,386,341 | A * | 1/1995 | Olson et al. ............... 361/749 |
| 6,014,316 | A * | 1/2000 | Eide ............................. 361/735 |
| 6,940,729 | B2 * | 9/2005 | Cady et al. ................... 361/767 |
| 2001/0040793 | A1 * | 11/2001 | Inaba ........................... 361/749 |
| 2002/0164838 | A1 * | 11/2002 | Moon et al. ................. 438/107 |
| 2002/0180022 | A1 * | 12/2002 | Emoto .......................... 257/686 |
| 2003/0164548 | A1 * | 9/2003 | Lee ............................... 257/738 |
| 2003/0164551 | A1 * | 9/2003 | Lee et al. ..................... 257/778 |
| 2004/0000707 | A1 * | 1/2004 | Roper et al. ................. 257/686 |
| 2004/0124527 | A1 * | 7/2004 | Chiu ............................. 257/723 |

* cited by examiner

*Primary Examiner* — Junghwa M Im  
(74) *Attorney, Agent, or Firm* — McAndrews, Held & Malloy (57) ABSTRACT

A semiconductor package has a first substrate having a plurality of electrically conductive patterns formed thereon. A first semiconductor die is coupled to the plurality of conductive patterns. A second semiconductor die is coupled to the first semiconductor die by a die attach material. A third semiconductor die is coupled to the second semiconductor die by a die attach material. A second substrate having a plurality of electrically conductive patterns formed thereon is coupled to the third semiconductor die. A plurality of contacts is coupled to a bottom surface of the first substrate. A connector jack is coupled to the second substrate. A plurality of leads is coupled to the second semiconductor die by conductive wires.

20 Claims, 9 Drawing Sheets

SEMICONDUCTOR PACKAGE HAVING A PLURALITY OF INPUT/OUTPUT MEMBERS

RELATED APPLICATIONS

The present application is a Divisional of U.S. patent application entitled, "SEMICONDUCTOR PACKAGE HAVING A PLURALITY OF INPUT/OUTPUT MEMBERS", having Ser. No. 10/972,686, and a filing date of Oct. 25, 2004 now U.S. Pat. No. 8,072,058 in the name of the same inventors and assigned to the same assignee.

BACKGROUND OF THE INVENTION

1. Field of the Invention

The present invention relates to a semiconductor package, and, more specifically, to a stacked semiconductor package having a plurality of input/output members.

2. Description of the Related Art

In typical semiconductor packages, a substrate is electrically connected to a semiconductor die mounted thereon. The substrate is then electrically and mechanically connected to an external device so as to ensure a stable electrical connection between the semiconductor die and the external device.

The substrate can be either a lead frame or a laminate circuit board. A semiconductor package using a lead frame is generally manufactured by bonding a semiconductor die onto a die paddle. The semiconductor die is coupled to a plurality of leads using conductive wires. The semiconductor die and the leads are encapsulated with an encapsulant, allowing part of the leads to be exposed from lateral sides of the encapsulant. The exposed leads are connected to an external device. On the other hand, a semiconductor package using a laminate circuit board is manufactured by bonding a semiconductor die onto a circuit board. The semiconductor die is coupled to the circuit board using conductive wires. The semiconductor die and the circuit board are encapsulated with an encapsulant and an array of solder balls are fused to one side of the circuit board. The solder balls being connected to the external device.

In conventional semiconductor packages using a lead frame, only the leads extending from lateral sides of the encapsulant, for example, in second and fourth directions of the encapsulant, are used as input/output members. Thus, the conventional semiconductor packages do not meet the demand for an increased number of input/output members. As an attempt to increase the number of the input/output members, it has been suggested to narrow the pitch of the leads or manufacture the semiconductor packages in a larger size. However, there is a technical limitation in narrowing the lead pitch during manufacture of a lead frame. Also, large-size semiconductor packages go against the current trend toward smaller and lighter packages.

In semiconductor packages using a laminate circuit board, solder balls arrayed on one side of a circuit board are used as input/output members. The semiconductor packages using a circuit board are smaller in size and have a larger number of input/output members than the packages using a lead frame.

However, conventional semiconductor packages in either type have a limitation on the number of input/output members because they use only one type of input/output members. In other words, leads are only used as input/output members in a semiconductor package using a lead frame, whereas solder balls are only used as input/output members in a semiconductor package using a circuit board. New type semiconductor packages using both leads and solder balls to increase the number of input/output members have not yet been available.

Also, conventional semiconductor packages have a low heat release efficiency because they only use either the leads or the solder balls as heat release paths. Due to a high degree of integration and complicated functions, recently available semiconductor packages generate more heat during operation than pre-existing ones. However, the packages cannot effectively release the generated heat with the limited number of heat release paths.

Therefore a need existed to provide a semiconductor package and a method of producing a semiconductor package that overcomes the above problems.

BRIEF SUMMARY OF THE INVENTION

A semiconductor package has a first substrate having a plurality of electrically conductive patterns formed thereon. A first semiconductor die is coupled to the plurality of conductive patterns. A second semiconductor die is coupled to the first semiconductor die by a die attach material. A third semiconductor die is coupled to the second semiconductor die by a die attach material. A second substrate having a plurality of electrically conductive patterns formed thereon is coupled to the third semiconductor die. A plurality of contacts is coupled to a bottom surface of the first substrate. A connector jack is coupled to the second substrate. A plurality of leads is coupled to the second semiconductor die by conductive wires.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1A:
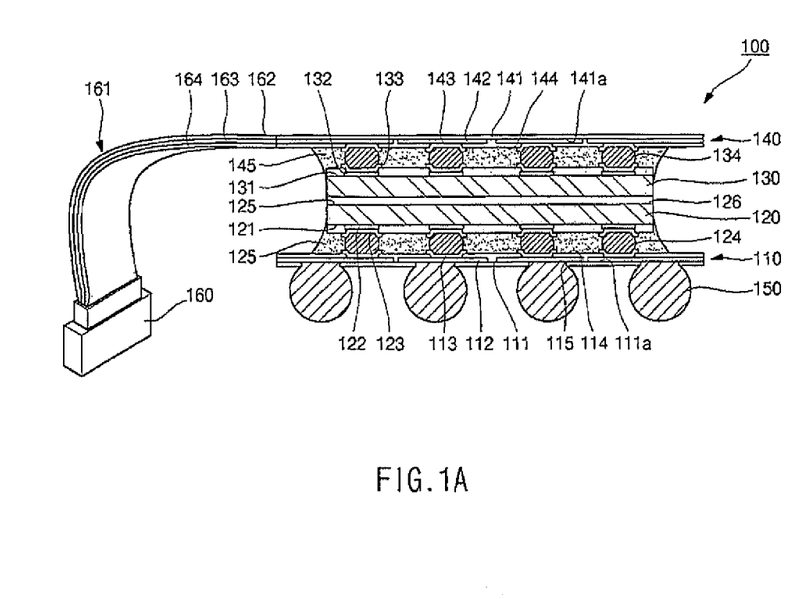
FIG. 1A is a cross-sectional view of a semiconductor package according to one embodiment of the present invention.
Figure 1B:
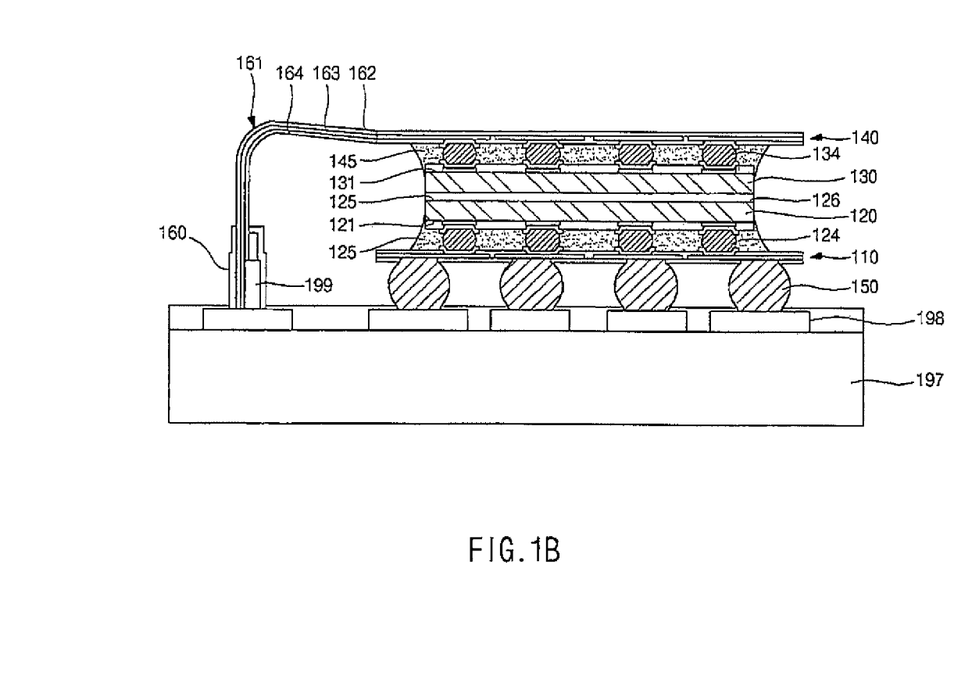
FIG. 1B is a cross-sectional view showing the semiconductor package in FIG. 1A mounted on an external device.

FIG. 1A is a cross-sectional view of a semiconductor package according to one embodiment of the present invention. FIG. 1B is a cross-sectional view showing the semiconductor package in FIG. 1A mounted on an external device.

As shown in FIGS. 1A and 1B, a semiconductor package 100 includes a first laminate circuit board 110, a first semiconductor die 120 electrically connected to the first laminate circuit board 110, a second semiconductor die 130 bonded to the first semiconductor die 120, a second laminate circuit board 140 electrically connected to the second semiconductor die 130, a plurality of solder balls 150 electrically connected to the first laminate circuit board 110 to be used as input/output members connected to an external device, and a jack 160 electrically connected to the second laminate circuit board 140 to be used as another input/output member connected to the external device.

The first laminate circuit board 110 has an insulative layer 111 as a base and a plurality of electrically conductive patterns 112 formed on a top surface 111a of the insulative layer 111. A plating layer 113 is formed on a certain part of each electrically conductive pattern 112. Also, a protective layer 114 is formed on the other parts of the electrically conductive patterns 112. The insulative layer 111 has a plurality of openings 115 through which portions of the electrically conductive patterns 112 are partially exposed. As will be explained hereafter, the solder balls 150 are fused to the electrically conductive patterns 112 exposed through the openings 115. The plating layer 113 can be made of but not limited to gold (Au), silver (Ag), nickel (Ni), palladium (Pd) or an equivalent thereof. All plating layers that will be explained hereafter can be made of such materials. Also, the first laminate circuit board 110 is not limited to have the foregoing structure and may have any other structure of a general laminate circuit board. For example, the first laminate circuit board 110 can be a general rigid printed circuit board, a flexible circuit film, a flexible circuit tape or an equivalent thereof. The same can be said for the second laminate circuit board 140.

The first semiconductor die 120 mounted on the first laminate circuit board 110 has a plurality of bond pads 122 on a bottom surface 121 thereof. A plating layer 123 is formed on the bottom of each bond pad 122. A plurality of first electrically conductive bumps 124 are interposed between the plating layer 123 and the plating layer 113 formed on the electrically conductive patterns 112. Thus the conductive bumps 124 electrically couple the first semiconductor die 120 to the first laminate circuit board 110. The electrically conductive bumps 124 can be made of, but not limited to, Au, Ag, Pb/Sn solder or an equivalent thereof. A first underfill 125 is applied to fill the remaining space between the first laminate circuit board 110 and the first semiconductor die 120 and surround the first electrically conductive bumps 124. Accordingly, the first underfill 125 can increase the reliability of interconnection between the first laminate circuit board 110 and the first semiconductor die 120 and protect the first electrically conductive bumps 124 from the external environment.

The second semiconductor die 130 is bonded to a top surface 125 of the first semiconductor die 120 by means of a die attach material 126 interposed there between. The die attach material 126 can be an epoxy adhesive, an adhesive tape or an equivalent thereof. However, the listing of the above materials should not be seen as to limit the scope of the present invention. The second semiconductor die 130 has a plurality of bond pads 132 on a top surface 131 thereof. A plating layer 133 having a predetermined thickness is formed on the bond pads 132. A plurality of second electrically conductive bumps 134 are fused to the plating layer 133.

The second laminate circuit board 140 has an insulative layer 141 as a base and a plurality of electrically conductive patterns 142 formed on a bottom surface 141a of the insulative layer 141. A plating layer 143 is formed on a certain part of each electrically conductive pattern 142, while a protective layer 144 is formed on the other parts of the electrically conductive patterns 142. The second electrically conductive bumps 134 explained above are interposed between the plating layer 133 formed on the second semiconductor die 130 and the plating layer 143 formed on the second laminate circuit board 140, thereby electrically coupling the second semiconductor die 130 to the second laminate circuit board 140. Also, a second underfill 145 is applied to fill the remaining space between the second semiconductor die 130 and the second laminate circuit board 140 and surround the second electrically conductive bumps 134. Accordingly, the second underfill 145 can increase the reliability of interconnection between the second semiconductor die 130 and the second laminate circuit board 140 and protect the second electrically conductive bumps 134 from the external environment.

As explained above, the solder balls 150 are fused to the bottom of the first laminate circuit board 110. To be more specific, the solder balls 150 are fused to the electrically conductive patterns 112 which are exposed downward through the openings 115 formed on the insulative layer 111. Via the solder balls 150 acting as input/output members, electric signals can be received or transmitted between the first semiconductor die 120 and the external device. As shown in FIG. 1B, the plurality of solder balls 150 are fused to input/output pads 198 formed on the external device 197.

The jack 160 electrically connected to the second laminate circuit board 140 is used as another input/output member. In other words, electric signals can be received or transmitted between the second semiconductor die 130 and the external device via the jack 160. The jack 160 is electrically connected to the second laminate circuit board 140 by a flexible circuit board 161. The flexible circuit board 161 includes an insulative layer 162, flexible electrically-conductive patterns 163 for connecting the electrically conductive patterns 142 of the second laminate circuit board 140 to the jack 160, and a protective layer 164 for covering the surface of the patterns 163. The flexible circuit board 161 can be of the same type and material as used for the second laminate circuit board 140. However, this should not be seen as to limit the scope of the present invention. Other types of material may be used without departing from the spirit and scope of the present invention. As shown in FIG. 1B, the jack 160 is connected to an input/output pin 199 formed on the external device 197.

In the semiconductor package 100, both the solder balls 150 arrayed at the bottom of the first laminate circuit board 110 and the jack 160 connected to the second laminate circuit board 140 can be used as input/output members. This structure is multi-pin semiconductor package 100 provides a larger number of input/output members in a limited space. Also, the semiconductor package 100 has high heat-release efficiency since the heat generated from the semiconductor dies are released outside through both the solder balls 150 and the jack 160.

Figure 2:
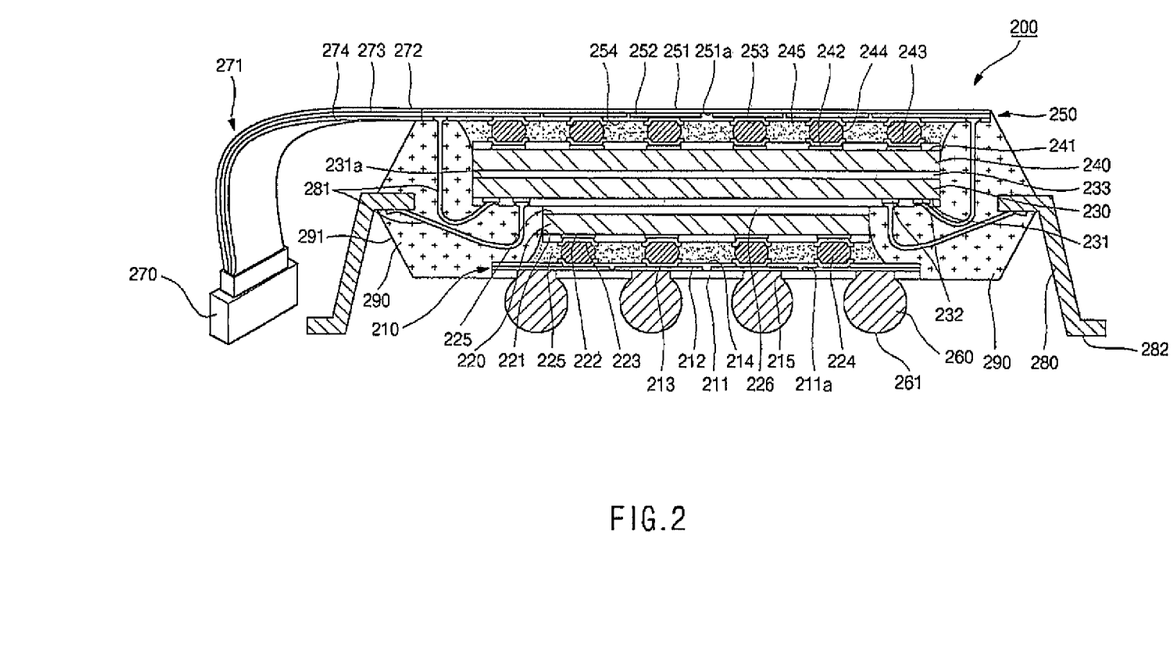
FIG. 2 is a cross-sectional view of a semiconductor package according to another embodiment of the present invention.

FIG. 2 is a cross-sectional view of a semiconductor package according to another embodiment of the present invention.

As shown in FIG. 2, a semiconductor package 200 includes a first laminate circuit board 210, a first semiconductor die 220 electrically connected to the first laminate circuit board 210, a second semiconductor die 230 bonded to the first semiconductor die 220, a third semiconductor die 240 bonded to the second semiconductor die 230, a second laminate circuit board 250 electrically connected to the third semiconductor die 240, a plurality of solder balls 260 electrically connected to the first laminate circuit board 210, a jack 270 electrically connected to the second laminate circuit board 250, a plurality of leads 280 electrically connected to the second semiconductor die 230, and an encapsulant 290 for encapsulating the first and second laminate circuit boards 210 and 250, the first, second and third semiconductor dies 220, 230 and 240, a plurality of conductive wires 281 and the plurality of leads 180.

The first laminate circuit board 210 has an insulative layer 211 as a base and a plurality of electrically conductive patterns 212 formed on a top surface 211a of the insulative layer 211. A plating layer 213 is formed on certain parts of each electrically conductive pattern 212. A protective layer 214 is formed on other parts of the electrically conductive patterns 212 not covered by the plating layer 213. The insulative layer 211 has a plurality of openings 215 through which the bottoms of the electrically conductive patterns 212 are partially exposed. As will be explained hereafter, the solder balls 260 are fused to the electrically conductive patterns 212 exposed through the openings 215.

The first semiconductor die 220 mounted on the first laminate circuit board 210 has a plurality of bond pads 222 on a bottom surface 221 thereof. A plating layer 223 is formed on the bottoms of the bond pads 222. A plurality of first electrically conductive bumps 224 are interposed between the plating layer 223 formed on the first semiconductor die 220 and the plating layer 213 formed on the electrically conductive patterns 212. The conductive bumps 224 electrically couple the first semiconductor die 220 to the first laminate circuit board 210. A first underfill 225 is applied to fill the space between the first laminate circuit board 210 and the first semiconductor die 220 and surround the first electrically conductive bumps 224. Accordingly, the first underfill 225 can increase the reliability of interconnection between the first laminate circuit board 210 and the first semiconductor die 220 and protect the first electrically conductive bumps 224 from the external environment.

The second semiconductor die 230 is bonded to a top surface 225 of the first semiconductor die 220 by means of a die attach material 226 interposed there between. The second semiconductor die 230 is larger in size than the first semiconductor die 220 and has a plurality of bond pads 232 on its bottom perimeter 231 which are not in direct contact with the first semiconductor die 220.

The third semiconductor die 240 is bonded to a top surface 231a of the second semiconductor die 230 by means of a die attach material 233 interposed there between. The third semiconductor die 240 has a plurality of bond pads 242 on a top surface 241 thereof. A plating layer 243 having a predetermined thickness is formed on the bond pads 242. A plurality of second electrically conductive bumps 244 are fused to the plating layer 244.

The second laminate circuit board 250 has an insulative layer 251 as a base and a plurality of electrically conductive patterns 252 formed on a bottom surface 251a of the insulative layer 251. A plating layer 253 is formed on a certain part of each electrically conductive pattern 252, while a protective layer 254 is formed on parts of the electrically conductive patterns 252 not covered by the plating layer 253. As explained above, the second electrically conductive bumps 244 are interposed between the plating layer 243 formed on the third semiconductor die 240 and the plating layer 253 formed on the second laminate circuit board 250, thereby electrically connecting the third semiconductor die 240 to the second laminate circuit board 250. A second underfill 245 is applied to fill the space between the third semiconductor die 240 and the second laminate circuit board 250 and surround the second electrically conductive bumps 244. Accordingly, the second underfill 245 can increase the reliability of interconnection between the third semiconductor die 240 and the second laminate circuit board 250 and protect the second electrically conductive bumps 244 from the external environment.

As explained above, the plurality of solder balls 260 are fused to the bottom of the first laminate circuit board 210. The solder balls 250 are fused to the electrically conductive patterns 212 which are exposed downward through the openings 215 formed on the insulative layer 211. Via the solder balls 250 acting as input/output members, electric signals can be received or transmitted between the first semiconductor die 220 and the external device. The solder balls 250 being fused to the input/output pads formed on the external device.

The jack 270 electrically connected to the second laminate circuit board 250 is used as another input/output member. In other words, electric signals can be received or transmitted between the third semiconductor die 240 and the external device via the jack 270. The jack 270 is electrically connected to the second laminate circuit board 250 by a flexible circuit board 271. The flexible circuit board 271 includes an insulative layer 272, flexible electrically-conductive patterns 273 for connecting the electrically conductive patterns 252 of the second laminate circuit board 250 to the jack 270, and a protective layer 274 for covering the surface of the patterns 273. The flexible circuit board 271 can be of the same type and material as used for the second laminate circuit board 250. The jack 270 is connected to an input/output pin formed on the external device.

The plurality of leads 280 are arrayed at the perimeter of the encapsulant 290 in a height approximately corresponding to that of the second semiconductor die 230. Each lead 280 is electrically connected to one of the bond pads 232 formed on the second semiconductor die 230 by a conductive wire 281 in order to be used as another input/output member. The other bond pads 232 are electrically connected to the electrically conductive patterns 252 of the second laminate circuit board 250. The protective layer 254 is not formed on the wire-bonding areas of the electrically conductive patterns 252 of the second laminate circuit board 250. Due to such electrical connections, electric signals can be received and transmitted between the second semiconductor die 230 and the external device via the jack 270. The leads 280 are bent twice to have a lower end 282 substantially coplanar to lower ends 261 of the solder balls 260. Accordingly, the leads 280 can be easily mounted on the input/output pads of the external device.

The encapsulant 290 encapsulates the first and second laminate circuit boards 210 and 250, the first, second and third semiconductor dies 220, 230 and 240, the plurality of conductive wires 281 and the plurality of leads 180 to safely protect them from the external environment. The encapsulant 290 prevents the fragile conductive wires 281 from being easily damaged by an external impact or rough handling. The encapsulant 290 also supports the leads 280 connected to the conductive wires 281 and prevents the leads 180 from being easily displaced. Of course, the leads 280 are mostly exposed outward from the lateral sides of the encapsulant 290 to be easily mounted onto the external device.

In the semiconductor package 200, the solder balls 260 arrayed at the bottom of the first laminate circuit board 210, the jack 270 connected to the second laminate circuit board 250 and the leads 280 exposed from the lateral sides 291 of the encapsulant 290 are all used as input/output members. This structure provides a multi-pin semiconductor package having a larger number of input/output members in a limited space. Also, the semiconductor package 200 has a high heat-release efficiency because the heat generated from the semiconductor dies are released outside through the solder balls 260, jack 270 and leads 280.

Figure 3A:
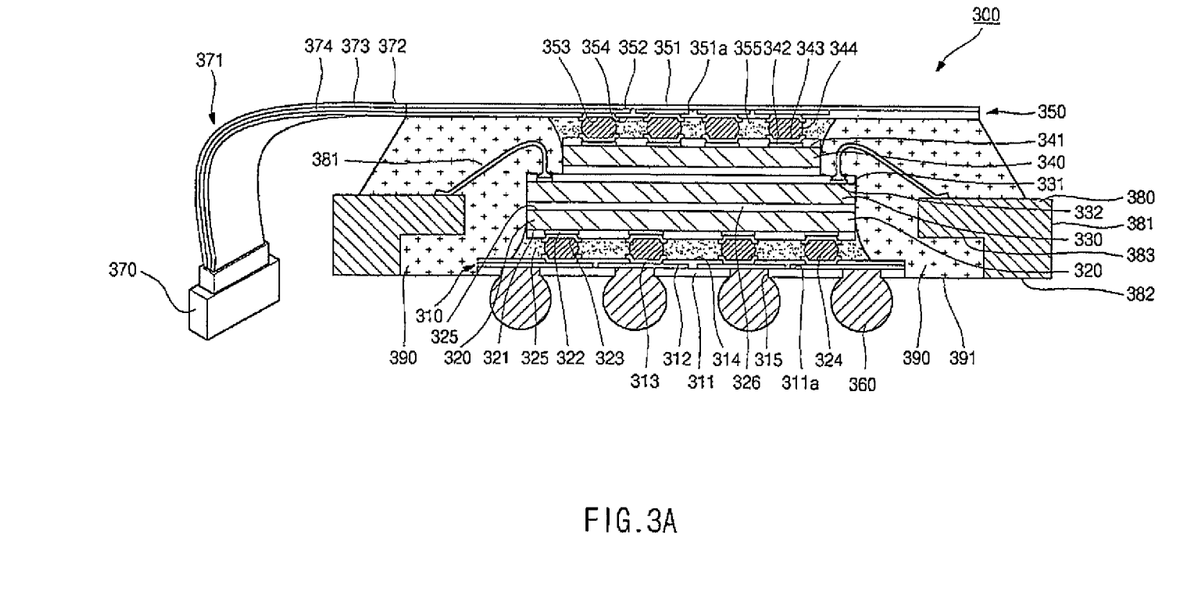
FIG. 3A a cross-sectional view of a semiconductor package according to still another embodiment of the present invention.
Figure 3B:
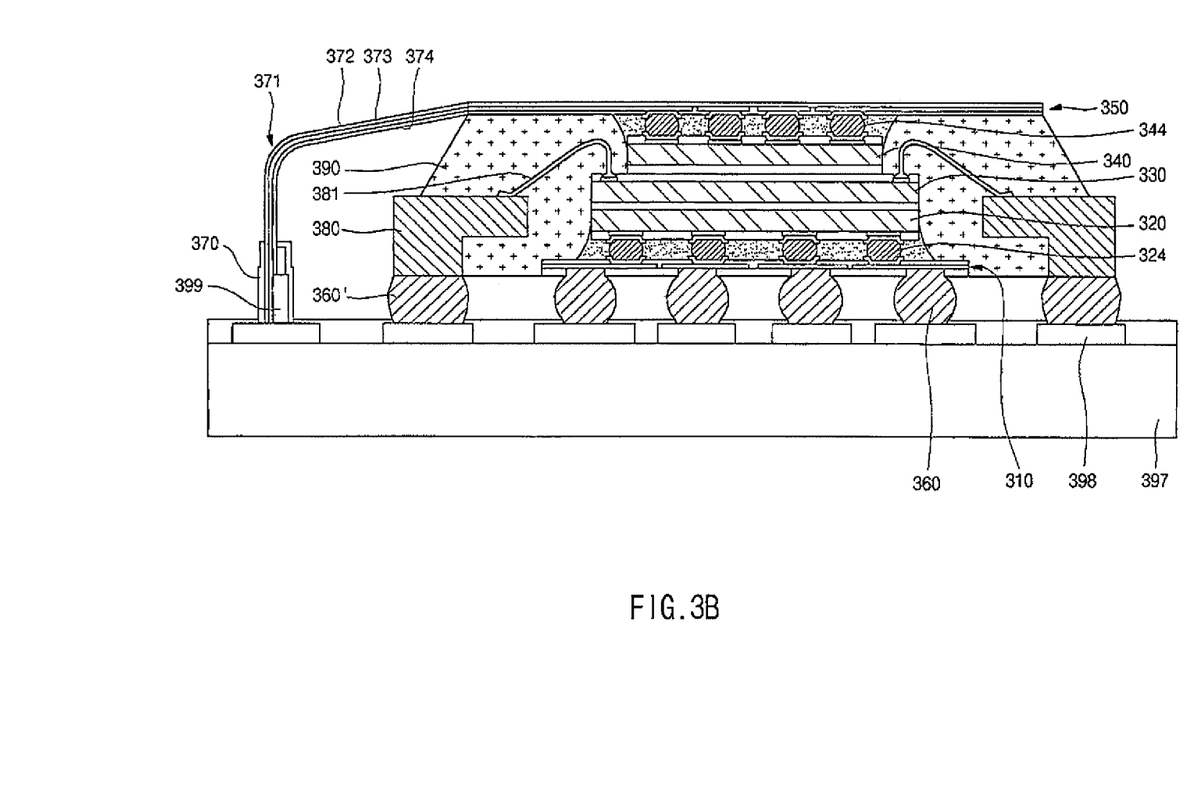
FIG. 3B is a cross-sectional view showing the semiconductor package in FIG. 3A mounted on an external device.

FIG. 3A is a cross-sectional view of a semiconductor package 300 according to still another embodiment of the present invention. FIG. 3B is a cross-sectional view showing the semiconductor package 300 in FIG. 3A mounted on an external device.

Since the semiconductor package 300 is basically similar in structure to the semiconductor package 200, only the differences between the two packages will be described.

As shown in FIGS. 3A and 3B, a second semiconductor die 330 has a plurality of bond pads 332 on a top perimeter 331 thereof. Since the bond pads 332 are formed on the top of the second semiconductor die 330, it is not required to make the second semiconductor die 330 larger than a first semiconductor die 320. On the other hand, a third semiconductor die 340 bonded to the top surface 331 of the second semiconductor die 330 should be smaller than the second semiconductor die 330 in order not to interrupt conductive wires 381 connected to the bond pads 332.

A plurality of leads 380 is arrayed at the perimeter of the encapsulant 390 in a height approximately corresponding to that of the second semiconductor die 330. Each lead 380 is mostly placed within the encapsulant 390, with only a lateral side 381 and a bottom 382 being exposed outward. An etched part 383 formed on each lead 380 within the encapsulant 390 improves the reliability of interconnection between each lead 380 and the encapsulant 390. As explained above, the conductive wires 381 are connected to the leads 380. The bottoms 382 of the leads 380 are approximately coplanar to a bottom 391 of the encapsulant 390 and higher than the bottoms of the solder balls 360. As shown in FIG. 3B, the bottoms 382 of the leads 380 are connected to input/output pads 398 of an external device 397 through solder pastes 360' which compensate for the difference in height between the bottoms 382 and the bottoms of the solder balls 360. Accordingly, such a difference in height does not cause any problem in mounting the semiconductor package 300 on the external device.

In the semiconductor package 300, the solder balls 360 arrayed at the bottom of the first laminate circuit board 310, the jack 370 connected to the second laminate circuit board 350 and the leads 380 fixed within the encapsulant 390 are all used as input/output members. This structure is a multi-pin semiconductor package that provides a larger number of input/output members in a limited space. Also, the semiconductor package 300 has a high heat-release efficiency because the heat generated from the semiconductor dies are released outside through the solder balls 360, jack 370 and leads 380.

Figure 4:
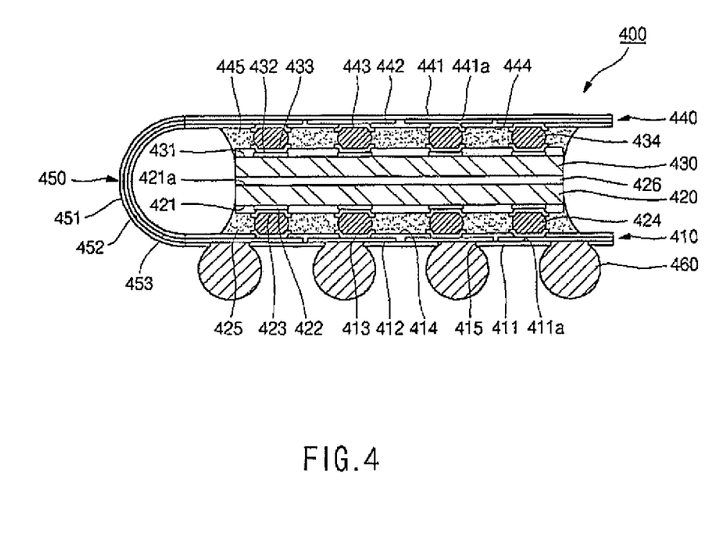
FIG. 4 is a cross-sectional view of a semiconductor package according to still another embodiment of the present invention; and, FIGS. 5A to 5D are cross-sectional views showing a process of manufacturing the semiconductor package in FIG. 4.

FIG. 4 is a cross-sectional view of a semiconductor package according to still another embodiment of the present invention.

As shown in FIG. 4, a semiconductor package 400 includes a first laminate circuit board 410, a first semiconductor die 420 electrically connected to the first laminate circuit board 410, a second semiconductor die 430 bonded to the first semiconductor die 420, a second laminate circuit board 440 electrically connected to the second semiconductor die 430, a flexible circuit board 450 for electrically connecting the first laminate circuit board 410 to the second laminate circuit board 440, and a plurality of solder balls 460 electrically connected to the first laminate circuit board 410.

The first laminate circuit board 410 has an insulative layer 411 as a base and a plurality of electrically conductive patterns 412 formed on a top surface 411a of the insulative layer 411. A plating layer 413 is formed on a certain part of each electrically conductive pattern 412. A protective layer 414 is formed on the parts of the electrically conductive patterns 412 not covered by the plating layer 413. The insulative layer 411 has a plurality of openings 415 through which the bottoms of the electrically conductive patterns 412 are partially exposed. As will be explained hereafter, the solder balls 460 are fused to the electrically conductive patterns 412 exposed through the openings 415.

The first semiconductor die 420 mounted on the first laminate circuit board 410 has a plurality of bond pads 422 on a bottom surface 421 thereof. A plating layer 423 is formed on the bottom of each bond pads 422. A plurality of first electrically conductive bumps 424 are interposed between the plating layer 423 formed on the first semiconductor die 420 and the plating layer 413 formed on the electrically conductive patterns 412, thereby electrically connecting the first semiconductor die 420 to the first laminate circuit board 410. A first underfill 425 is applied to fill the remaining space between the first laminate circuit board 410 and the first semiconductor die 420 and surround the first electrically conductive bumps 424. Accordingly, the first underfill 425 can increase the reliability of interconnection between the first laminate circuit board 410 and the first semiconductor die 420 and safely protect the first electrically conductive bumps 424 from the external environment.

The second semiconductor die 430 is bonded to a top surface 421a of the first semiconductor die 420 by means of a die attach material 426 interposed there between. The second semiconductor die 430 has a plurality of bond pads 432 on a top surface 431 thereof. A plating layer 433 having a predetermined thickness is formed on the bond pads 432. Also, a plurality of second electrically conductive bumps 434 are fused to the plating layer 433.

The second laminate circuit board 440 has an insulative layer 441 as a base and a plurality of electrically conductive patterns 442 formed on a bottom surface 441a of the insulative layer 441. A plating layer 443 is formed on a certain part of each electrically conductive pattern 442, while a protective layer 444 is formed on the other parts of the electrically conductive patterns 442. As explained above, the second electrically conductive bumps 434 are interposed between the plating layer 433 formed on the second semiconductor die 430 and the plating layer 443 formed on the second laminate circuit board 440, thereby electrically connecting the second semiconductor die 430 to the second laminate circuit board 440. A second underfill 445 is applied to fill the remaining space between the second semiconductor die 430 and the second laminate circuit board 440 and surround the second electrically conductive bumps 434. Accordingly, the second underfill 445 can increase the reliability of interconnection between the second semiconductor die 430 and the second laminate circuit board 440 and protect the second electrically conductive bumps 434 from the external environment.

The flexible circuit board 450 electrically connects the first laminate circuit board 410 to the second laminate circuit board 440. The flexible circuit board 450 includes an insulative layer 451 and flexible electrically-conductive patterns 452 formed on the insulative layer 451. The flexible electrically-conductive patterns 452 connect the electrically conductive patterns 412 of the first laminate circuit board 410 to the electrically conductive patterns 442 of the second laminate circuit board 440. The flexible electrically-conductive patterns 452 is coated with a protective layer 453 to be protected from the external environment.

The plurality of solder balls 460 are fused to the bottom of the first laminate circuit board 40. The solder balls 460 are fused to the electrically conductive patterns 412 which are exposed downward through the openings 415 formed on the insulative layer 411. Via the solder balls 460 acting as input/output members, electric signals can be received or transmitted between the first and second semiconductor dies 420 and 430 and the external device. In other words, electric signals from the first semiconductor die 420 are transferred to the solder balls 460 via the bond pads 422, plating layer 423, first electrically conductive bumps 424, plating layer 413 and electrically conductive patterns 412. Electric signals from the second semiconductor die 430 are transferred to the solder balls 460 via the bond pads 432, plating layer 433, second electrically conductive bumps 434, plating layer 443, electrically conductive patterns 442, flexible electrically-conductive patterns 452 of the flexible circuit board 450, electrically conductive patterns 412 of the first laminate circuit board 410. Electric signals from the external device are transferred to the first semiconductor die 420 or the second semiconductor die 430 in reverse order.

In the semiconductor package 400, only the solder balls 460 arrayed at the bottom of the first laminate circuit board 410 are used as input/output members. However, both the first semiconductor die 420 and the second semiconductor die 430 can transfer or receive electric signals to or from the external device via the solder balls 460. Therefore, this structure is for containing multiple semiconductor dies in a limited mounting area of the semiconductor package.

FIGS. 5A to 5D are cross-sectional views showing a process of manufacturing the semiconductor package 400 in FIG. 4.

Referring to FIGS. 5A to 5D, the semiconductor package 400 is manufactured by a method comprising the steps of: providing first and second laminate circuit boards 410 and 440; electrically connecting a first semiconductor die 420 to the first laminate circuit board 410 and a second semiconductor die 430 to the second laminate circuit board 440; bonding the second semiconductor die 430 onto the first semiconductor die 420; and fusing a plurality of solder balls 460 to the first laminate circuit board 410.

Figure 5A:
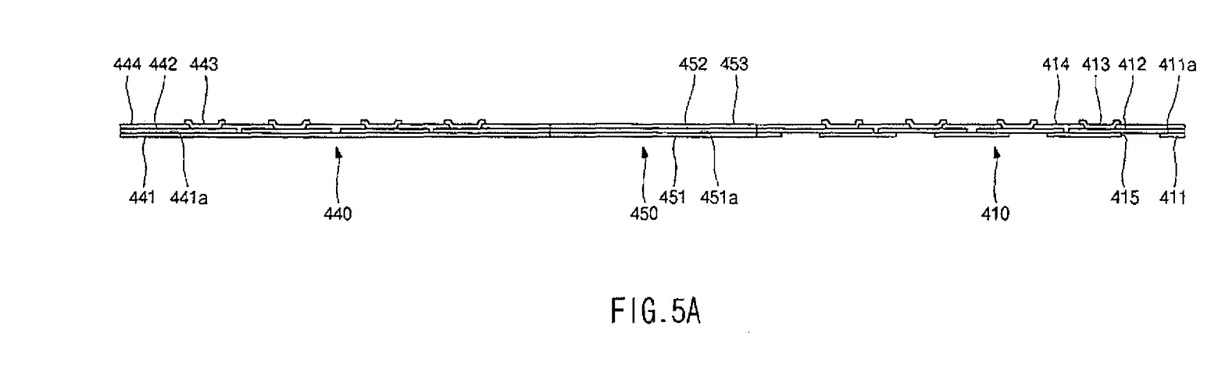

FIG. 5A shows the step of providing the first and second laminate circuit boards 410 and 440 which are interconnected by a flexible circuit board 450. The first laminate circuit board 410 has an insulative layer 411 as a base and a plurality of electrically conductive patterns 412 formed on a top surface 411a of the insulative layer 411. A plating layer 413 is formed on a certain part of each electrically conductive pattern 412. A protective layer 414 is formed on the electrically conductive patterns 412 not covered by the plating layer 413. The insulative layer 411 has a plurality of openings 415 through which the bottoms of the electrically conductive patterns 412 are partially exposed. The second laminate circuit board 440 has an insulative layer 441 as a base and a plurality of electrically conductive patterns 442 formed on a bottom surface 441a of the insulative layer 441. A plating layer 443 is formed on a certain part of each electrically conductive pattern 442, while a protective layer 444 is formed on the electrically conductive patterns 442 not covered by the plating layer 443. The flexible circuit board 450 electrically connects the first laminate circuit board 410 to the second laminate circuit board 440. The flexible circuit board 450 includes an insulative layer 451, flexible electrically-conductive patterns 452 formed on the insulative layer 451 and a protective layer 453 coated on the flexible electrically-conductive patterns 452. The insulative layer 451 of the flexible circuit board 450 connected to the insulative layers 411 and 441 of the first and second laminate circuit boards 410 and 440. The flexible electrically-conductive patterns 452 are connected to the electrically conductive patterns 412 and 442 of the first and second laminate circuit boards 410 and 440. Also, the protective layer 453 is connected to the protective layers 414 and 444 of the first and second laminate circuit boards 410 and 440.

Figure 5B:
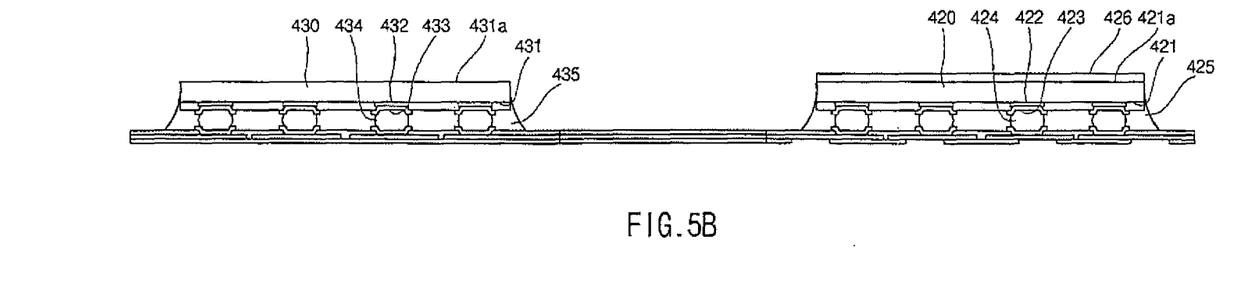

FIG. 5B shows the step of electrically connecting the first and second semiconductor dies 420 and 430 to the first and second laminate circuit boards 410 and 44Q respectively. The first and second semiconductor dies 420 and 430 have a plurality of bond pads 422 and 432 on bottom surfaces 421 and 432 thereof. Also, plating layers 423 and 433 are formed on the bond pads 422 and 432. A plurality of first electrically conductive bumps 424 are interposed between the plating layer 423 formed on the first semiconductor die 420 and the plating layer 413 formed on the electrically conductive patterns 412, thereby electrically connecting the first semiconductor die 420 to the first laminate circuit board 410. A plurality of second electrically conductive bumps 434 are interposed between the plating layer 433 of the second semiconductor die 430 and the playing layer 444 of the second laminate circuit board 440, thereby electrically connecting the second semiconductor die 430 to the second laminate circuit board 440. A first underfill 425 is applied to fill the remaining space between the first laminate circuit board 410 and the first semiconductor die 420 and surround the first electrically conductive bumps 424. Also, a second underfill 445 is applied to fill the remaining space between the second semiconductor die 430 and the second laminate circuit board 440 and surround the second electrically conductive bumps 434. The first and second underfills 425 and 445 increase the reliability of interconnection between the first semiconductor die 420 and the first laminate circuit board 410 and between the second semiconductor die 430 and the second laminate circuit board 440. The first and second underfills 425 and 445 also protect the first and second electrically conductive bumps 424 and 434 from the external environment.

Figure 5C:
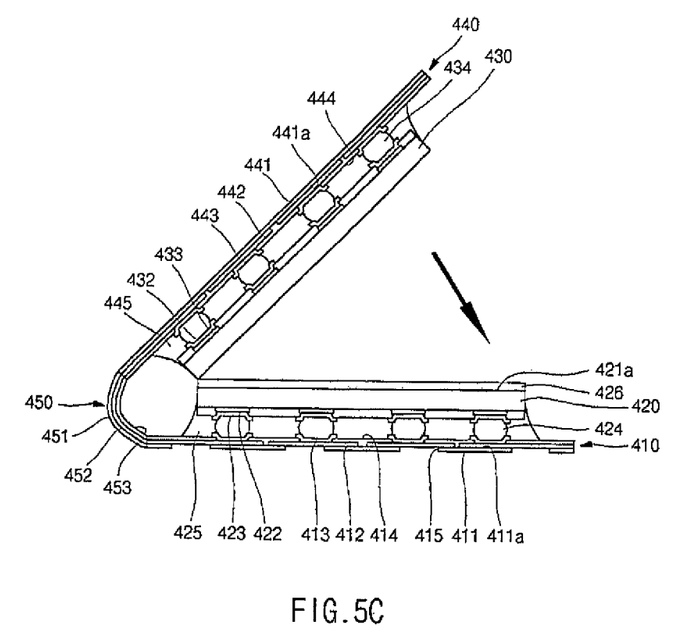

FIG. 5C shows the step of bonding the second semiconductor die 430 onto the first semiconductor die 420. The second semiconductor die 430 is bonded to a top surface 421a of the first semiconductor die 420 by means of a die attach material 426 interposed there between. At this time, the flexible circuit board 450 connecting the first and second laminate circuit board becomes curved into a C shape.

Figure 5D:
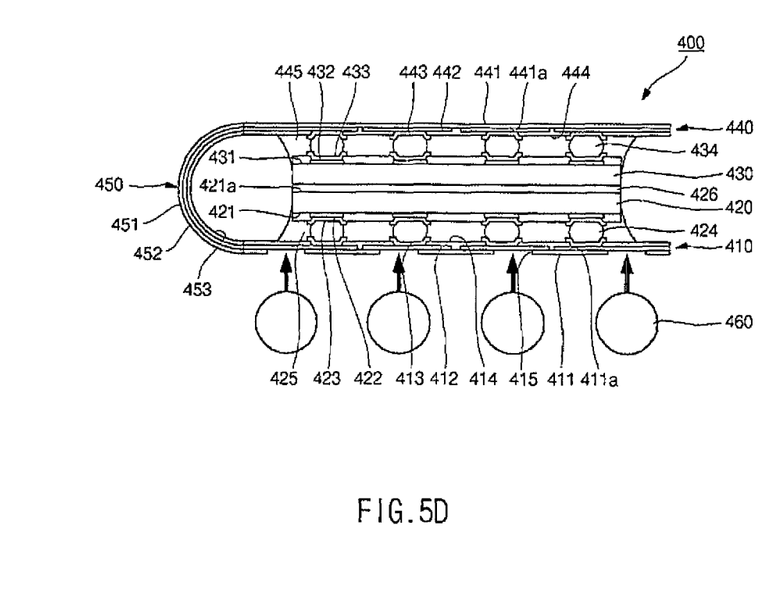

FIG. 5D shows the step of fusing a plurality of solder balls 460. The solder balls 460 are reflowed and fused to the electrically conductive patterns 412 which are exposed downward through the openings 415 formed on the insulative layer 411.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package comprising:
   a first substrate;
   a first plurality of electrically conductive patterns formed on the first substrate;
   a first semiconductor die coupled to the first plurality of conductive patterns;
   a second substrate;
   a second plurality of electrically conductive patterns formed on the second substrate;
   a second semiconductor die coupled to the second plurality of electrically conductive patterns and to the first semiconductor die by a die attach material; and
   a flexible circuit board for electrically connecting the first substrate to the second substrate.

2. The semiconductor package according to claim 1, further comprising a plurality of contacts electrically connected to the first substrate.

3. The semiconductor package according to claim 1, wherein said first and second substrate each comprises:

an insulative layer wherein the first and second plurality of electrically conductive patterns are formed on one side of the insulative layer;

a plating layer formed on a predetermined parts of the first and second plurality of electrically conductive patterns; and a protective layer formed on the first and second plurality of electrically conductive patterns not covered by the plating layer.

4. The semiconductor package according to claim 3, wherein the insulative layer of the first substrate is formed under the first plurality of electrically conductive patterns and has a plurality of openings through which a bottom area of the first plurality of electrically conductive patterns are partially exposed, the plurality of contacts coupled to the exposed sections.

5. The semiconductor package according to claim 1 further comprising a first underfill to fill a space between the first substrate and the first semiconductor die.

6. The semiconductor package according to claim 1 further comprising a second underfill fill a space between the second substrate and the third semiconductor die.

7. The semiconductor package according to claim 1, further comprising:

a plurality of bond pads on a bottom surface of the first semiconductor die;

a plating layer formed on the bottoms of the bond pads; and a plurality of first electrically conductive bumps fused to the plating layer.

8. The semiconductor package according to claim 1, further comprising a plurality of bond pads on a bottom surface of the second semiconductor die, the bottom surface of the second semiconductor die facing a position opposite of the first semiconductor die.

9. The semiconductor package according to claim 1, wherein the flexible circuit board comprises:

a flexible substrate having flexible electrically-conductive patterns formed thereon, the flexible electrically-conductive patterns coupled to the electrically conductive patterns of the first substrate and to the electrically conductive patterns of the second substrate.

10. The semiconductor package according to claim 1, wherein the flexible circuit board further comprises a protective layer applied to the flexible electrically-conductive patterns.

11. The semiconductor package according to claim 1, wherein an inactive surface of the second semiconductor die is attached to an inactive surface of the first semiconductor die by the die attach material.

12. A semiconductor package comprising:

a first substrate;

a first plurality of electrically conductive patterns formed on the first substrate;

a first semiconductor die coupled to the first plurality of conductive patterns;

a second substrate;

a second plurality of electrically conductive patterns formed on the second substrate;

a second semiconductor die coupled to the second plurality of electrically conductive patterns and to the first semiconductor die by a die attach material; and means for electrically connecting the first substrate to the second substrate.

13. The semiconductor package according to claim 12, wherein said first and second substrate each comprises:

an insulative layer wherein the first and second plurality of electrically conductive patterns are formed on one side of the insulative layer;

a plating layer formed on a predetermined parts of the first and second plurality of electrically conductive patterns; and means formed on the first and second plurality of electrically conductive patterns not covered by the plating layer for protecting the conductive patterns.

14. The semiconductor package according to claim 12 further comprising means for filling a space between the first substrate and the first semiconductor die.

15. The semiconductor package according to claim 14 further comprising means for filling a space between the second substrate and the third semiconductor die.

16. The semiconductor package according to claim 12, further comprising:

a plurality of bond pads on a bottom surface of the first semiconductor die;

a plating layer formed on the bottoms of the bond pads; and a plurality of first electrically conductive bumps fused to the plating layer.

17. The semiconductor package according to claim 12, further comprising a plurality of bond pads on a bottom surface of the second semiconductor die, the bottom surface of the second semiconductor die facing a position opposite of the first semiconductor die.

18. The semiconductor package according to claim 12, wherein the means for electrically connecting the first substrate to the second substrate comprises:

a flexible substrate having flexible electrically-conductive patterns formed thereon, the flexible electrically-conductive patterns coupled to the electrically conductive patterns of the first substrate and to the electrically conductive patterns of the second substrate.

19. A method of manufacturing a semiconductor package comprising:

providing a first substrate having a first plurality of electrically conductive patterns formed on the first substrate and a second substrate having a second plurality of electrically conductive patterns formed on the second substrate, wherein the first substrate and the second substrate are electrically coupled together by a flexible substrate;

coupling a first semiconductor die coupled to the first plurality of conductive patterns;

coupling a second semiconductor die to the first semiconductor die by a die attach material; and bonding the first semiconductor die to the second semiconductor die.

20. The method of claim 19, wherein bonding the first semiconductor die to the second semiconductor die further comprises bending the flexible substrate to attach an inactive surface of the first semiconductor die to an inactive surface of the second semiconductor die.

* * * * *